(12) United States Patent
Murai et al.

(10) Patent No.: US 11,219,146 B2
(45) Date of Patent: Jan. 4, 2022

(54) COMPONENT MOUNTER WITH AN ADJUSTMENT JIG

(71) Applicant: FUJI CORPORATION, Chiryu (JP)

(72) Inventors: Masaki Murai, Nishio (JP); Toshihiko Yamasaki, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 21 days.

(21) Appl. No.: 16/624,330

(22) PCT Filed: Jul. 12, 2017

(86) PCT No.: PCT/JP2017/025368
§ 371 (c)(1),
(2) Date: Dec. 19, 2019

(87) PCT Pub. No.: WO2019/012615
PCT Pub. Date: Jan. 17, 2019

(65) Prior Publication Data
US 2020/0128706 A1   Apr. 23, 2020

(51) Int. Cl.
*B23P 19/00* (2006.01)
*H05K 13/00* (2006.01)
*H05K 13/04* (2006.01)

(52) U.S. Cl.
CPC ....... *H05K 13/0015* (2013.01); *H05K 13/041* (2018.08); *H05K 13/0409* (2018.08)

(58) Field of Classification Search
CPC .............. H05K 13/0015; H05K 13/02; H05K 13/0409; H05K 13/041
See application file for complete search history.

(56) References Cited

U.S. PATENT DOCUMENTS 5,490,664 A * 2/1996 Justus .............. H01B 13/01209
269/66
10,256,011 B2 * 4/2019 Rouleau ................. H01R 43/20
(Continued)

FOREIGN PATENT DOCUMENTS

| CN | 201739292 U | 2/2011 |
| JP | 2006-319168 A | 11/2006 |
| WO | WO 2014/118929 A1 | 8/2014 |

OTHER PUBLICATIONS

International Search Report dated Oct. 17, 2017 in PCT/JP2017/025368 filed Jul. 12, 2017.
(Continued)

*Primary Examiner* — Paul D Kim
(74) *Attorney, Agent, or Firm* — Oblon, McClelland, Maier & Neustadt, L.L.P.

(57) ABSTRACT

An adjustment jig for performing position alignment of nozzle holders, including: multiple positioning pins including a primary insertion section configured such that multiple nozzle holders of a primary side device are insertable into the primary insertion section and a secondary insertion section configured such that multiple nozzle holders of a secondary side device are insertable into the secondary insertion section; and a board member configured such that the multiple positioning pins protruding to an opposite side to the primary insertion section and the secondary insertion section can be attached at a specified fixing position via a fixing section, a position of which is adjustable.

2 Claims, 8 Drawing Sheets

(56) References Cited

U.S. PATENT DOCUMENTS

2011/0268413 A1* 11/2011 Cote .................. G02B 6/4471
　　　　　　　　　　　　　　　　　　　385/135
2015/0382520 A1　　12/2015　Takamiya et al.

OTHER PUBLICATIONS

Extended European Search Report dated May 26, 2020 in corresponding European Patent Application No. 17917655.7 citing document AO therein, 9 pages.

* cited by examiner

FIG. 8 ical Field

The present disclosure relates to an adjustment jig for performing position alignment of a nozzle holder provided in a supply side device and a receiving side device provided with multiple suction nozzles that perform transfer of multiple components, and an alignment method for performing position alignment of the nozzle holder using the adjustment jig.

BACKGROUND ART

A component mounter for mounting a component on a circuit board is adapted to be fitted with a die supply device for supplying, for example, dies, as disclosed in patent literature 1. The die supply device is provided with a wafer pallet on which is loaded a dicing sheet to which multiple diced dies are adhered, and a supply head for picking up and holding a die using a suction nozzle in order to remove dies from the dicing sheet. A die picked up and held by the supply head of the die supply device is transferred to a mounting head provided on a component mounter. That is, the mounting head of the component mounter is provided with a suction nozzle in a similar manner and is configured to pick up and hold a die and mount the die on a circuit board.

CITATION LIST

Patent Literature

Patent literature 1: WO2014-118929

BRIEF SUMMARY

Technical Problem

However, the above conventional examples of a supply head and a mounting head are configured with multiple nozzle holders each and the same quantity of suction nozzles. Therefore, between the die supply device and the component mounter, multiple dies at a time can be transferred from the die supply device side to the component mounter side. However, to transfer multiple dies at a time, it is necessary to align the positions of the multiple suction nozzles of the supply head and the multiple suction nozzles of the mounting head with each other. Therefore, with a die supply device and a component mounter, it is necessary to perform work of aligning the positions of suction nozzles with respect to a die supply head and a die mounting head. This position alignment is an operation requiring accuracy because the components to be transferred are extremely small.

Thus, to solve the above problems it is an object of the present disclosure to provide an adjustment jig and an alignment method for performing position alignment of a nozzle holder.

Solution to Problem

An adjustment jig according to an embodiment of the present disclosure includes: multiple positioning pins including a primary insertion section configured such that multiple nozzle holders of a primary side device are insertable into the primary insertion section and a secondary insertion section configured such that multiple nozzle holders of a secondary side device are insertable into the secondary insertion section; and a board member configured such that the multiple positioning pins protruding to an opposite side to the primary insertion section and the secondary insertion section can be attached at a specified fixing position via a fixing section, a position of which is adjustable.

An alignment method according to an embodiment of the present disclosure includes: a primary side process of inserting multiple positioning pins into multiple nozzle holders of a primary side device, and fixing the multiple positioning pins in an inserted state with respect to a board member; and a secondary side process of inserting the positioning pins fixed at the specified position with respect to the board member into multiple nozzle holders of a secondary side device and fixing the nozzle holders positioned based on the positioning pins with respect to a device main body.

Advantageous Effects

According to the above configuration, the positional relationships between the multiple nozzle holders on the primary side device and the multiple nozzle holders on the secondary side device can be easily matched by performing the alignment in the primary side process and the secondary side process using the adjustment jig.

DESCRIPTION OF EMBODIMENTS

An embodiment of an adjustment jig and an alignment method according to the present disclosure is described below with reference to the figures. In the present embodiment, using a component mounter for mounting components on a circuit board and a die supply device attached to the component mounter as examples, an adjustment jig used by both devices and a nozzle holder alignment method using the adjustment jig will be described. In descriptions of the present embodiment, a die is taken as an example of a component as with a conventional example, but the component to be handled may be another electronic component or the like.

Figure 1:
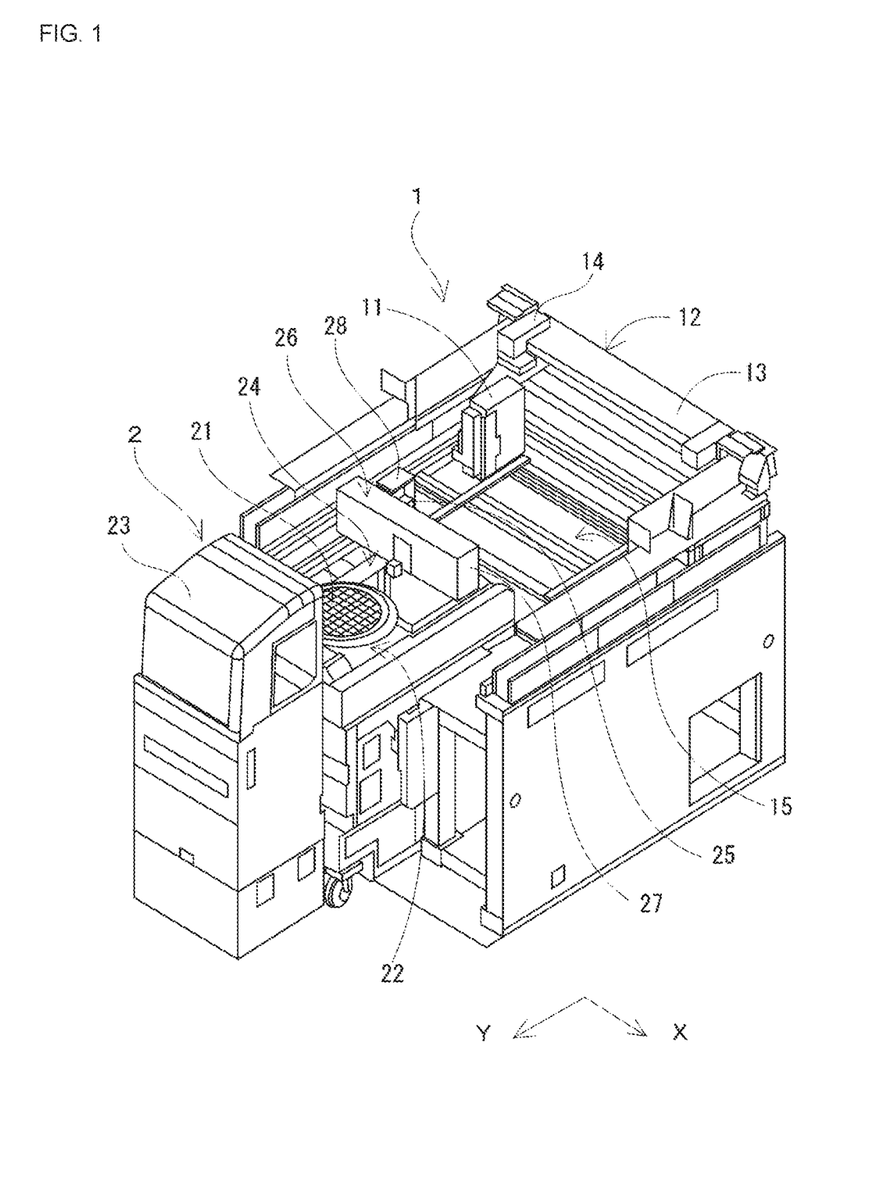
FIG. 1 is a perspective view showing a state with a die supply device set on a component mounter.

FIG. 1 is a perspective view showing a state with a die supply device set on a component mounter. Component mounter 1 is provided with mounting head 11 capable of picking up and holding die 21 or the like supplied from die supply device 2. Component mounter 1 is provided with XY moving mechanism 12 (XY robot) that moves mounting head 11 to any position in an XY plane. In the present embodiment, as shown in the figures, the longitudinal direction of the body of component mounter 1 is the Y-axis direction, and the width direction of the body of the component mounter is the X-axis direction. Thus, XY moving mechanism 12 includes Y slide 13 that slides in the Y-axis direction, with X slide 14 that can slide in the X-axis direction being assembled on Y slide 13. Further, mounting head 11 is attached to X slide 14.

With component mounter 1, die 21 is picked up and held by suction by mounting head 11, and is mounted on a circuit board arranged in the body of the component mounter. For this purpose, component mounter 1 is provided with conveyor 15 for conveying the circuit board. Conveyor 15 is configured such that a widthwise direction (X-axis direction) of the body of the component mounter is the traveling direction of the circuit board. Thus, the circuit board enters and leaves component mounter 1 in the width direction of the body, and is transferred to and from a screen printer or other component mounter or the like arranged adjacent to the component mounter in the width direction.

Die 21 to be mounted on a circuit board is supplied from die supply device 2 attached to component mounter 1. Die supply device 2 is provided with magazine 23 for housing wafer pallets 22 in multiple levels, with a dicing sheet, to which a diced wafer is adhered, being set on the wafer pallets 22. The dicing sheet is attached to a dicing frame, and the dicing frame is attached to the pallet main body by screwing or the like. Die supply die 12 is provided with removal mechanism 35 that pulls out wafer pallet 22 from magazine 23 onto stage 24.

Further, die supply device 2 is also provided with supply head 25 for transferring multiple dies 21 at a time to and from mounting head 11 of the component mounter 1. Supply head 25 is mounted on head moving mechanism 26 (XY robot) that moves in the XY plane. Head moving mechanism 26 is assembled with X slide 28 slidable in the X-axis direction with respect to Y slide 27 that is slidable in the Y-axis direction, with supply head 25 being detachably mounted with respect to X slide 28.

Supply head 25 is configured with multiple suction nozzles that can move vertically. Supply head 25 is also provided with a flipping mechanism configured to flip the suction nozzles that are in a state pointing downwards. Thus, after dies 21 arranged with their mounting surface facing up have been picked up by the suction nozzles, supply head 25 can make the non-mounting surface of the dies 21 face up by flipping the suction nozzles. This enables the multiple dies 21 to be transferred between the suction nozzles of supply head 25 and the suction nozzles of mounting head 11.

With mounting head 11 of the present embodiment, four suction nozzles are attached, but the quantity of suction nozzles depends on the type of mounting head. Component mounter 1 is configured such that mounting heads having different quantities of such suction nozzles are exchangeable. On the other hand, as described above, for supply head 25 that transfers dies 21 to and from mounting head 11, the quantity of nozzles matches the quantity on mounting head 11. Therefore, supply head 25 also has a detachable configuration, and can be replaced with a supply head having the same nozzle quantity as mounting head 11.

For mounting head 11 and supply head 25 that have the same quantity of nozzles to transfer multiple dies 21 at a time, not only does the quantity of nozzles have to be the same, the arrangement of each suction nozzle must match. If a deviation in the arrangement of suction nozzles on mounting head 11 and supply head 25 arises, reliable transfer will not be possible, which will affect mounting onto the circuit board. Thus, with component mounter 1, the multiple dies 21 held by suction are imaged by a camera, and the position of each die 21 is calculated from the image data. As a result, if the positions of all the dies 21 do not coincide with the nozzle positions of mounting head 11, the dies 21 are transferred one by one.

However, this fails to make use of the ability of mounting head 11 and supply head 25 to transfer multiple dies 21 at a time. Therefore, in the present embodiment, in order to make use of the full functionality of mounting head 11 and supply head 25, an adjustment jig for matching the positional relationships of the multiple suction nozzles and an alignment method using the adjustment jig are proposed.

Figure 2:
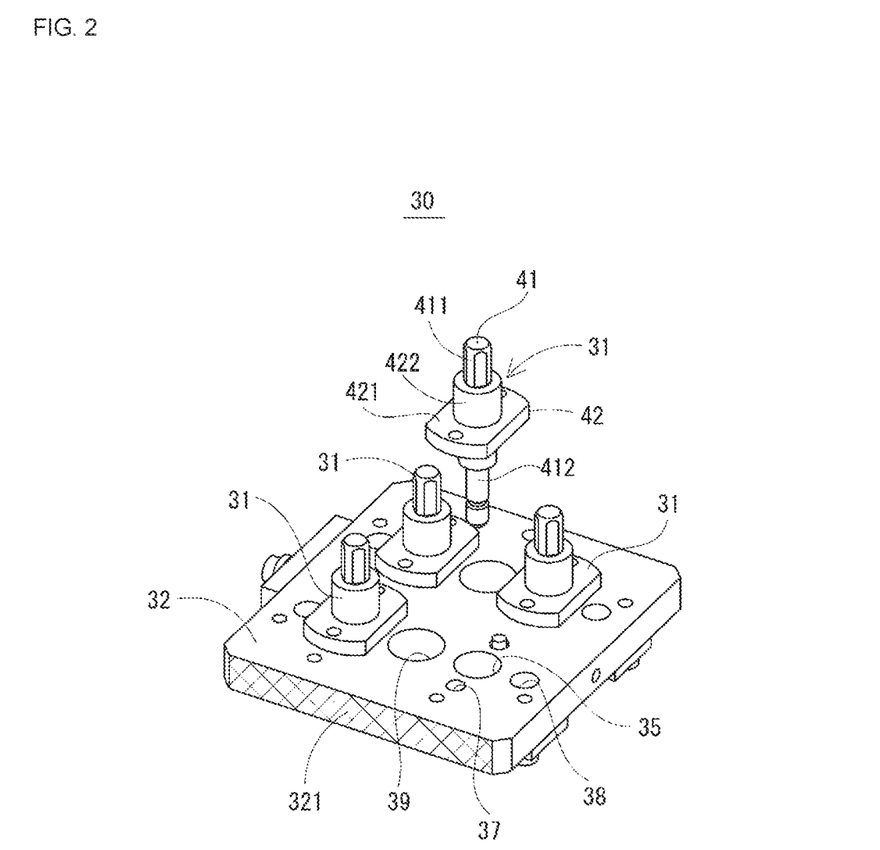
FIG. 2 is a perspective view showing an adjustment jig from a surface corresponding to nozzle holders of a primary side device.
Figure 3:
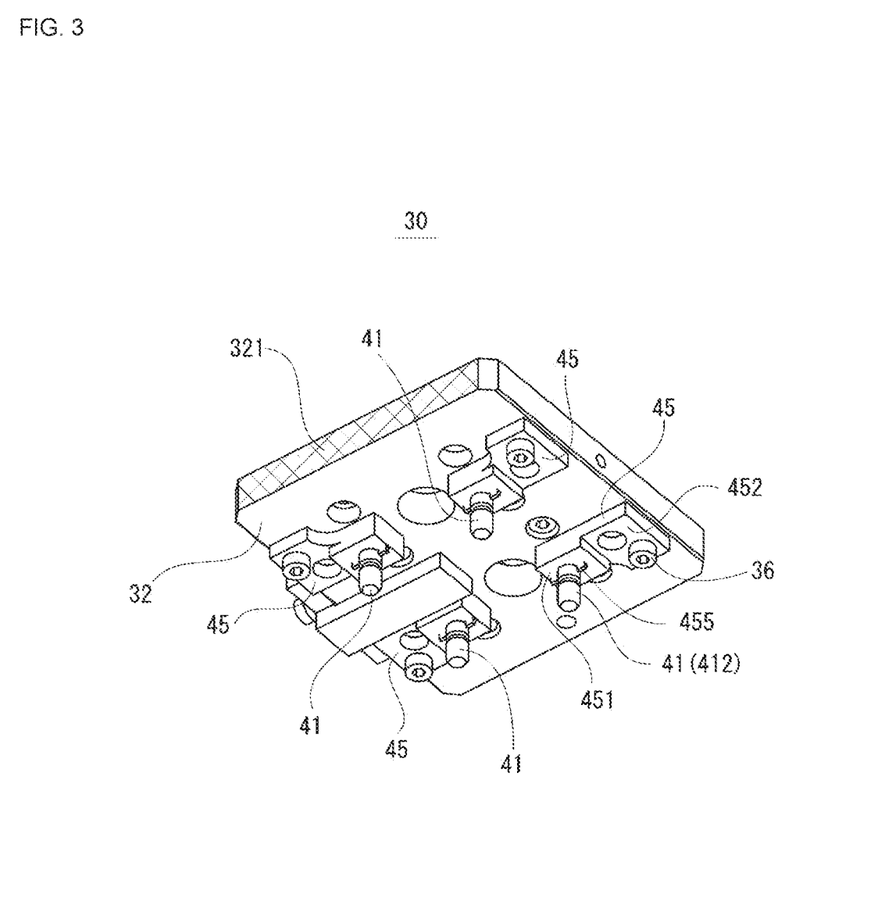
FIG. 3 is a perspective view showing the adjustment jig from a surface corresponding to nozzle holders of a secondary side device.

The multiple suction nozzles provided on mounting head 11 and supply head 25 are configured to be attachable to and detachable from their respective nozzle holders. Thus, to align the positions of the suction nozzles means aligning the positions of the nozzle holders. Therefore, an adjustment jig of the present embodiment performs alignment of the nozzle holders provided on mounting head 11 and supply head 25. Here, FIGS. 2 and 3 are perspective views showing the nozzle holder adjustment jig. In particular, FIG. 2 is a perspective view showing a primary side of an adjustment jig with respect to mounting head 11 that is used first, and FIG. 3 is a perspective view showing a secondary side of the adjustment jig with respect to supply head 25 that is used second.

Adjustment jig 30 is provided with pin members 31 in accordance with the quantity of suction nozzles, that is, the quantity of nozzle holders. In the present embodiment, four pin members 31 are fixed to and integrated with board 32. Board 32 is formed with four positioning holes 35 for arranging the four pin members 31, and bolt through-holes 37 and the like are formed around the periphery of positioning holes 35 such that fastening bolts 36 can be inserted. On the other hand, with pin member 31, positioning pin 41 and flange member 42 are integrally formed.

Positioning pin 41 has, on either side of flange member 42, primary side insertion section 411 with respect to a nozzle holder of mounting head 11, and secondary side insertion section 412 with respect to a nozzle holder of supply head 25, the secondary side insertion section 412 being formed on the other side of flange member 42 to primary side insertion section 411. Primary side insertion section 411 and secondary side insertion section 412 are formed in accordance with the shapes of nozzle holders of mounting head 11 and supply head 25, respectively. In the present embodiment, the mounting head 11 side is a reference, and the positions are aligned such that the position of the nozzle holder on the reference side is transferred to the nozzle holder on the supply head 25 side. Therefore, although mounting head 11 is described as a primary side device and supply head 25 is described as a secondary side device, the present disclosure is not particularly limited to such a relationship, and supply head 25 may be a primary side device and mounting head 11 may be a secondary side device by performing the alignment in a reverse manner.

Flange member 42 has cylindrical section 422 integrally formed so as to penetrate the center of flange portion 421, and positioning pin 41 is inserted into cylindrical section 422 to constitute pin member 31. Positioning holes 35 of board 32 are formed to have a diameter larger than that of cylindrical section 422. Therefore, cylindrical section 422 inserted into positioning hole 35 fits loosely such that pin member 31 can move in a radial direction (in the horizontal plane direction of board 32). Pin member 31 is inserted into positioning hole 35 from a side of board 32, as shown in FIG. 2, and pin member 31 is attached with flange portion 421 abutting against board 32. Further, as shown in FIG. 3, fixing block 45 is arranged on the other side of flange portion 421 with respect to board 32.

Fixing block 45 has pin support portion 451 for supporting secondary side insertion section 412 of positioning pin 41 that has penetrated board 32, and fastening portion 452 for bolt fastening. A pin hole through which positioning pin 41 passes is formed in pin support portion 451, and secondary side insertion section 412 protrudes as shown in FIG. 3. Pair of fitting protrusions 455 are formed on fixing block 45 with positioning pin 41 sandwiched by pin support portion 451, and are loosely fitted into a fitting recess formed on the nozzle holder side of supply head 25. On the other hand, a through-hole through which fastening bolt 36 passes is formed on the fastening portion 452 side.

With adjustment member 30, flange portion 421 of flange member 42 and fixing block 45 sandwich board 32 and pin member 31 is fixed to board 32 by fastening bolts that have been passed through fixing block 45 inserted into screw holes of flange member 42. Since there is a gap with pin member 31 and fastening bolt 36 respectively inserted into positioning hole 35 and bolt through-hole 37, it is possible to finely adjust pin member 31 with respect to the horizontal surface direction of board 32. Further, board 32 is a rectangular plate member having a chamfered corner, and a side surface of one of the four sides is formed as reference surface 321.

Figure 4:
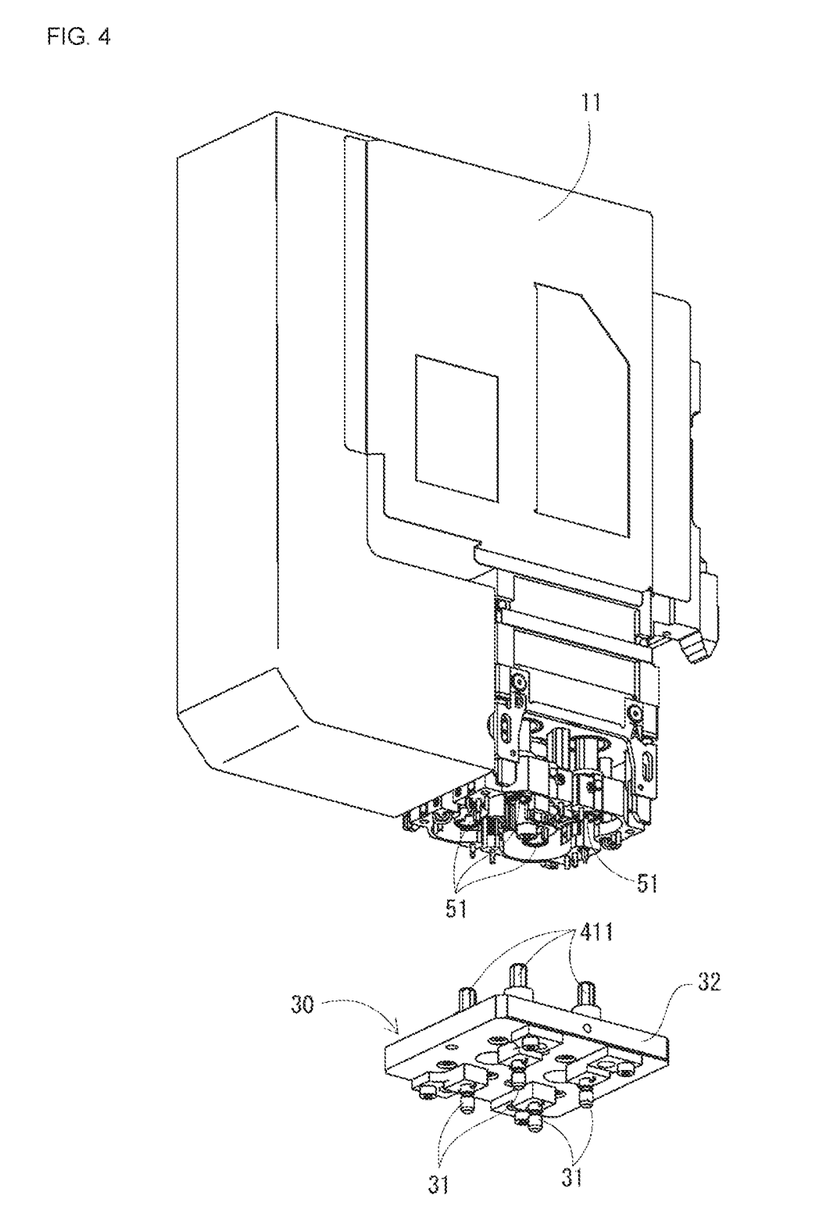
FIG. 4 is a perspective view showing a primary side process for a mounting head.
Figure 5:
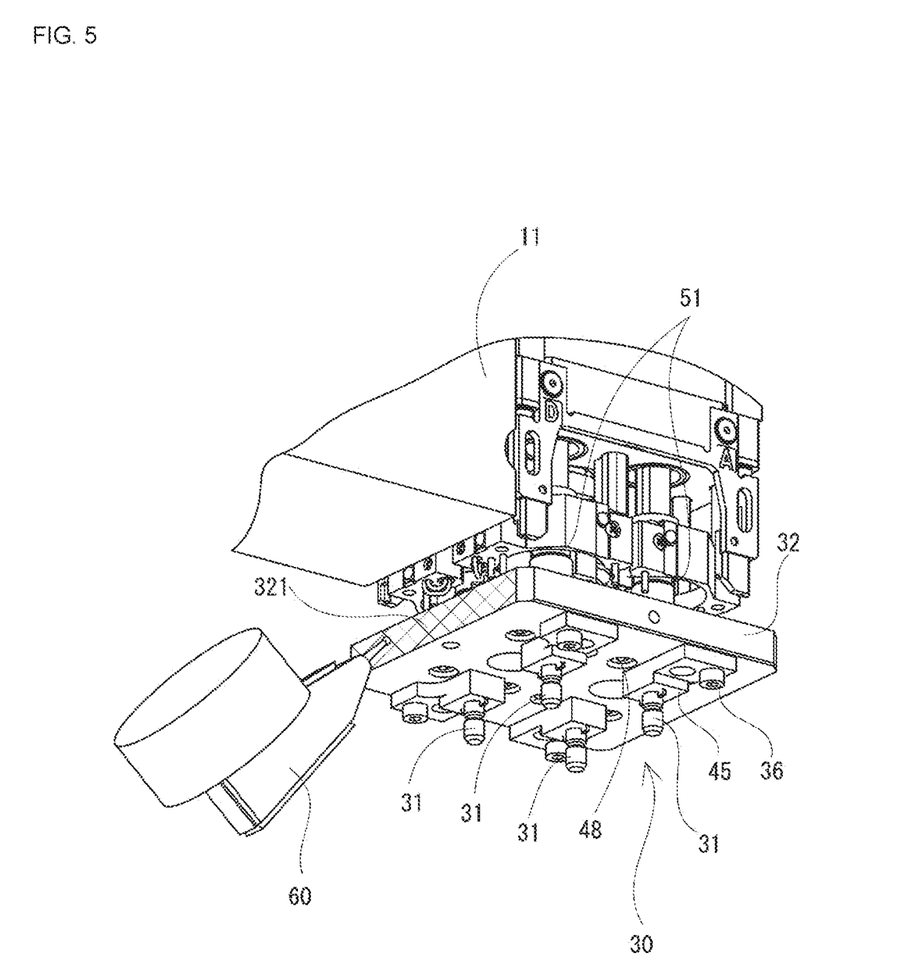
FIG. 5 is an enlarged perspective view showing a state in which the adjustment jig has been mounted by the primary side process.
Figure 6:
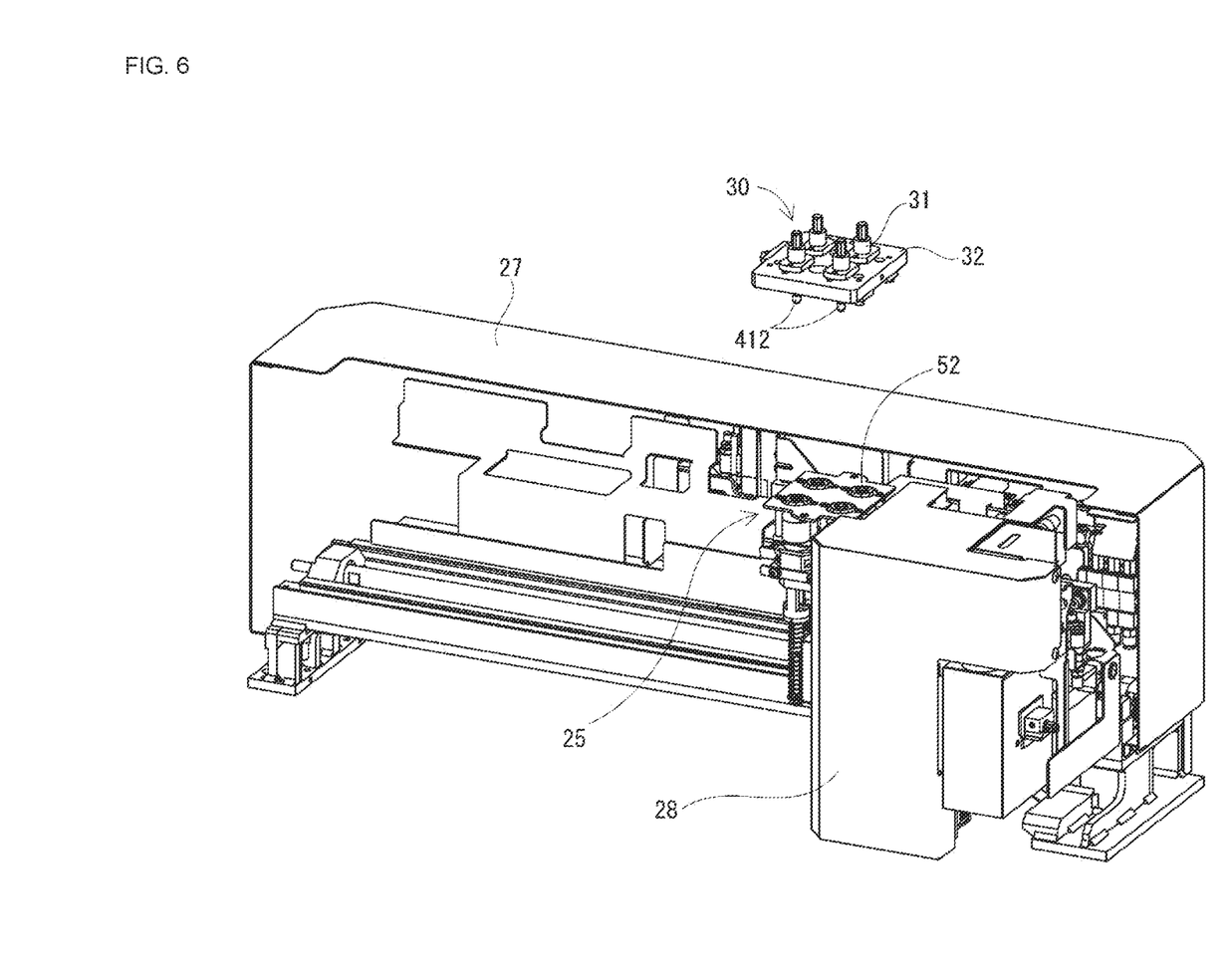
FIG. 6 is a perspective view showing a secondary side process for a supply head.
Figure 7:
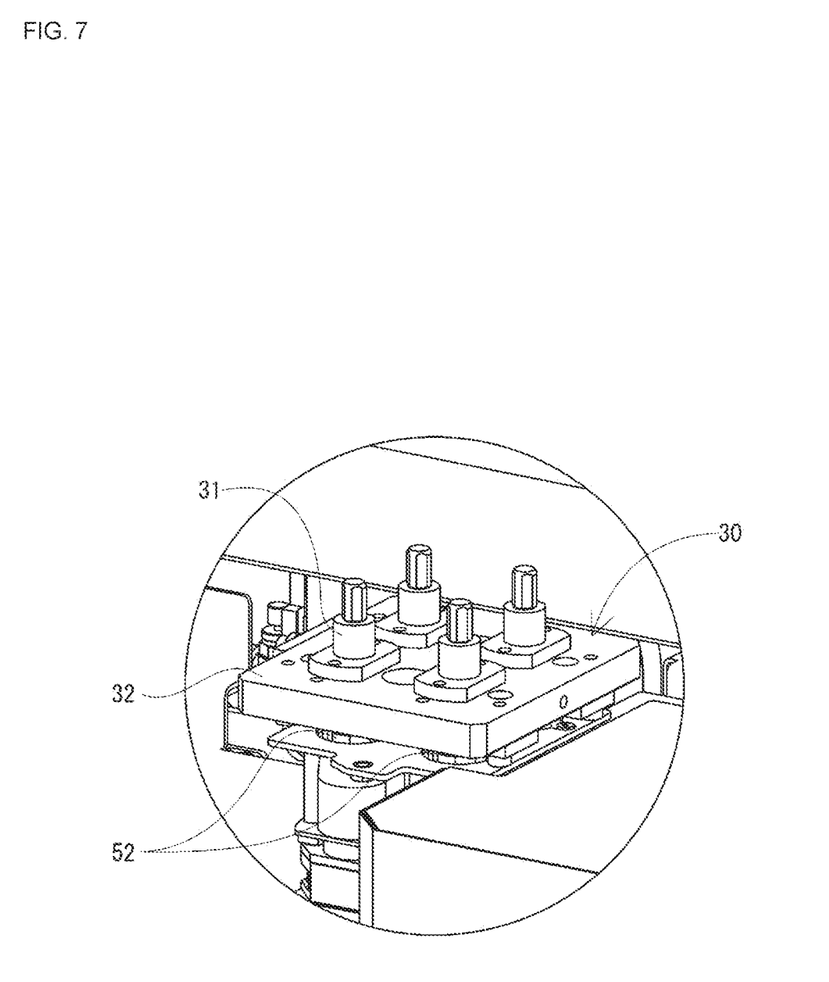
FIG. 7 is an enlarged perspective view showing a state in which the adjustment jig has been mounted by the secondary side process.
Figure 8:
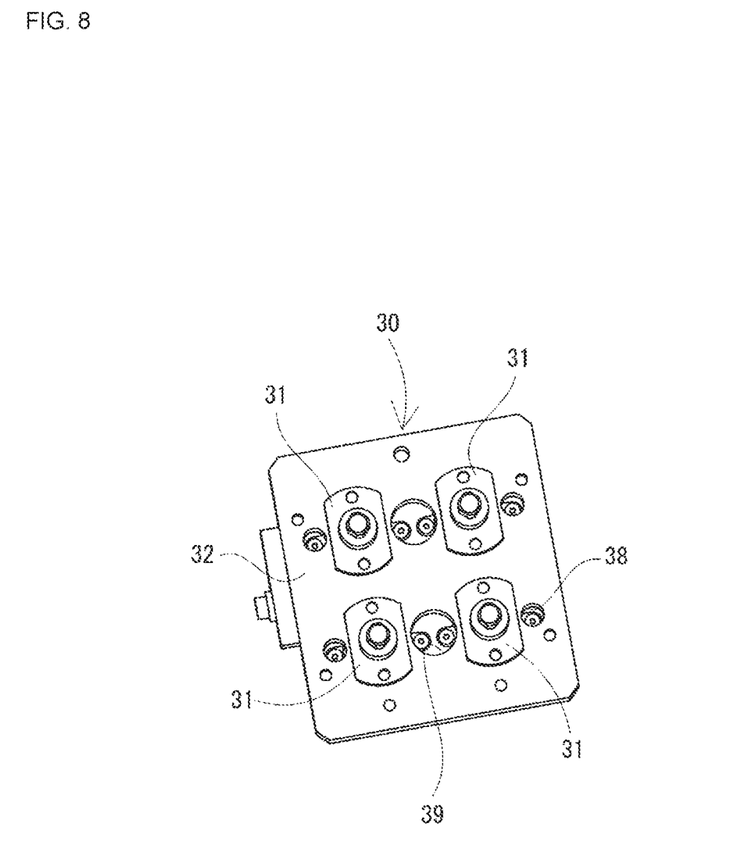
FIG. 8 shows bolts fastening of nozzle holders on the supply head side.

Next, a nozzle holder alignment method using adjustment jig 30 will be described. Each process in the alignment is described with reference to FIGS. 4 to 8. In particular, FIGS. 4 and 5 illustrate a primary side process for mounting head 11, and FIGS. 6-8 illustrate a secondary side process for supply head 25.

With primary side mounting head 11, the opening sections of nozzle holders 51 are arranged on the underside such that suction nozzles are attached pointing down. Further, with mounting head 11, the four nozzle holders 51 are fixed in advance at predetermined positions. Therefore, in the primary side process, adjustment jig 30 is attached to mounting head 11 from the lower side, and at this time, pin members 31 of adjustment jig 30, in particular, primary side insertion sections 411 of positioning pins 41, are inserted so as to be aligned with the positions of nozzle holders 51.

At this stage, since pin members 31 are loosely fitted to board 32, each pin member 31 is positioned with respect to board 32 slightly shifted in position in accordance with the four nozzle holders 51. Then, board 32 is attached to mounting head 11 as shown in FIG. 5, but support bolts 48 for mounting head 11 are not fully tightened. In other words, board 32 itself is also adjustable. Therefore, adjustment work is also performed with respect to board 32 to align reference surface 321 with the reference axis.

The reference axis of the present embodiment is the X axis of the XY plane along which mounting head 11 is moved. Thus, board 32 shown in FIG. 5 is arranged such that reference surface 321 is parallel to the X axis. For this purpose, by performing measurement with a micrometer contacting reference surface 321, the direction of reference surface 321 in the XY plane with respect to board 32 is finely adjusted such that reference surface 321 is parallel to the X axis. Then, pin members 31 are fixed to board 32 that has been aligned with the reference axis. That is, by tightening fastening bolts 36, board 32 is sandwiched between flange member 42 and fixing block 45, such that pin member 31 is integrated with board 32.

By such a primary side process, adjustment jig 30 aligns the positional relationships of the four nozzle holders 51 by the four pin members 31 with respect to board 32 aligned with the reference axis. Then, adjustment jig 30 is removed from mounting head 11, and the alignment work proceeds to the secondary side process performed on the nozzle holders of supply head 25. Here, supply head 25 is flipped as shown in FIG. 6 such that nozzle holders 52 are disposed with the opening sections facing up. The supply head 25, which is the secondary side device, has a fixing configuration in which the four nozzle holders 52 are each adjustable with respect to the device main body.

Therefore, as shown in FIG. 7, pin members 31 of adjustment jig 30, in particular, secondary side insertion sections 412 of positioning pins 41 are inserted into nozzle holders 52. Upon which, the movable nozzle holder 52 follows the positioning pins 41, and when positional deviation occurs, the position of each nozzle holder 52 is finely adjusted by the amount of the deviation. That is, since the positional relationship of the four positioning pins 41 with the four nozzle holders of mounting head 11 was obtained in the primary side process, the same positional relationship is transferred to nozzle holders 52 of supply head 25.

Further, at this time, arrangement work to align reference surface 321 along the reference axis is performed with respect to board 32. The reference axis is, as in the case of the mounting head 11, the X axis of the XY plane in which supply head 25 moves. Thus, using measurement with a micrometer contacting reference surface 321, which is not shown, the direction of reference surface 321 in the XY plane with respect to board 32 is finely adjusted such that reference surface 321 is parallel to the X axis. Then, the positional relation between pin members 31 of board 32 aligned with the reference axis is transferred to nozzle holders 52 of supply head 25. Thus, the four nozzle holders 52 are each fixed to the device main body of supply head 25. Specifically, as shown in FIG. 8, a tool is inserted through work holes 38 and 39 formed in board 32, and screw members are fastened to the four nozzle holders 52.

Accordingly, with the present embodiment, the positional relationships between the four nozzle holders 51 of mounting head 11 and the four nozzle holders 52 of supply head 25 are made to match each other by performing alignment in the primary side process and the secondary side process using adjustment jig 30. Therefore, the positions of the suction nozzles mounted on the respective nozzle holders 51 and 52 coincide with each other, and the components can be accurately transferred from supply head 25 to mounting head 11. Such alignment effects can be obtained by a simple operation of transferring the arrangement of nozzle holders 51 of the primary side device to nozzle holders 52 of the secondary side device using adjustment jig 30. Also, with each of mounting head 11 and supply head 25, by arranging adjustment jig 30 with reference to the X axis, alignment can be performed for more accurate transfer of the components in accordance with the movement.

The above describes an embodiment of the present disclosure, but embodiments are not limited to these and various changes may be employed without departing from the scope of the disclosure.

For example, although adjustment jig 30 of the above embodiment is provided with four pin members 31 in board 32, the quantity and arrangement of the positioning pins can be changed freely in accordance with the nozzle holders of the target device.

REFERENCE SIGNS LIST

1: component mounter;
2: die supply device;
11: mounting head;
21: die;
25: supply head;
30: adjustment jig;
31: pin member;
32: board;
35: positioning hole;
36: fastening bolt;
37: bolt through-hole;
41: positioning pin;
42: collar member;
411: primary insertion section;
412: secondary insertion section

The invention claimed is:

1. A component mounter, comprising:
 a mounting head including first nozzle holders;
 a supply head including second nozzle holders, the supply head configured to transfer components to the mounting head; and
 an adjustment jig including:
  multiple positioning pins each including a primary insertion section insertable into one of the first nozzle holders and a secondary insertion section insertable into one of the second nozzle holders, the primary insertion section and the secondary insertion section being on opposite sides of the positioning pins; and
  a board member including multiple positioning holes, a position of which is adjustable, the positioning pins being insertable into the positioning holes with the primary insertion section and the secondary insertion section on opposite sides of the board member.

2. The adjustment jig according to claim 1, wherein the board member has a reference surface for aligning with a respective reference axis of each of the first nozzle holders and the second nozzle holders.

* * * * *